(12) United States Patent  (10) Patent No.: US 7,474,349 B2
Ohmura  (45) Date of Patent: Jan. 6, 2009

(54) IMAGE-TAKING APPARATUS

(75) Inventor: Yusuke Ohmura, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 1113 days.

(21) Appl. No.: 10/742,245

(22) Filed: Dec. 18, 2003

(65) Prior Publication Data

US 2004/0135896 A1  Jul. 15, 2004

(30) Foreign Application Priority Data

Dec. 26, 2002  (JP)  ............... 2002-377673

(51) Int. Cl.
*H04N 5/225* (2006.01)
*H04N 3/14* (2006.01)
*H04N 5/235* (2006.01)

(52) U.S. Cl. .................. 348/340; 348/277; 348/362

(58) Field of Classification Search ......... 348/273–280, 348/340, 345, 349
See application file for complete search history.

(56) References Cited

U.S. PATENT DOCUMENTS 5,081,535 A * 1/1992 Kondo et al. ............ 348/230.1
6,388,709 B1 * 5/2002 Kobayashi et al. .......... 348/362
7,084,905 B1 * 8/2006 Nayar et al. .............. 348/222.1

FOREIGN PATENT DOCUMENTS

| EP | 0 710 039 A2 | 1/1996 |
|---|---|---|
| EP | 0 896 480 A1 | 10/1999 |
| EP | 1067802 A2 | 6/2000 |
| EP | 1067802 A3 | 6/2000 |
| JP | 01-078212 | 3/1989 |
| JP | 1-248542 A | 10/1989 |
| JP | 3-286566 A | 12/1991 |
| JP | 2870234 | 3/1999 |
| JP | 2001-78212 A | 3/2001 |
| WO | 93/11631 | 6/1993 |

* cited by examiner

*Primary Examiner*—Lin Ye
*Assistant Examiner*—Trung Diep
(74) *Attorney, Agent, or Firm*—Morgan & Finnegan, LLP

(57) ABSTRACT

An image-taking apparatus is disclosed that includes an image-pickup portion having a plurality of image-pickup regions, and a plurality of image-forming portions respectively corresponding to the plurality of image-pickup regions. The plurality of image-forming portions of the image-taking apparatus include a combination of image-forming portions that form object images on the corresponding image-pickup regions, by using light of mutually different wavelength regions. The image-forming portions constituting the combination have mutually different F numbers or mutually different apertures diameters of stops.

8 Claims, 9 Drawing Sheets

(A)

(B)

(C)

IMAGE-TAKING APPARATUS

BACKGROUND OF THE INVENTION

1. Field of the Invention

The present invention relates to image-taking apparatuses, such as digital cameras and video cameras that are capable of taking moving images or still images.

2. Description of Related Art

In digital cameras, an object image is exposed for the desired period of time onto a solid-state image-pickup element, such as a CCD sensor or CMOS sensor, in response to pressing a release button, and after converting the resulting image signal into a digital signal, predetermined processing such as YC processing is carried out, and an image signal of a predetermined format is obtained. This digital image signal can be recorded in a semiconductor memory. Then, the recorded image signals can be read out at any time and reproduced by displayable or printable signals, or the recorded images can be visualized by outputting them on a monitor.

Known forms of exposing the object image include the following approaches (see Japanese Patent No. 2870234, for example):

(A) RGB (red, green and blue) color filters in which, for example, 2×2 pixels are taken as a group are formed on a solid-state image-pickup element to provide the pixels one by one with wavelength selectivity, and thus the object image is separated into individual red, green and blue images;

(B) the solid-state image-pickup element is not provided with wavelength selectivity, but optical filters provided with wavelength selectivity are inserted into the image-taking optical system, and are switched chronologically; and (C) a color separation optical system is added behind the image-taking optical system, and an image is picked up by using a different image-pickup element for each wavelength region.

Moreover, image-taking apparatuses are known that have image-pickup regions that are partitioned into the three color components red, green and blue, that are overall very small, and that have a high-level performance (see Japanese Patent Application Laid-Open No. 2001-78212 (corresponds to EP 1067802A3)).

In any of the approaches of the conventional exposure forms (A), (B) and (C), the image-taking optical system is shared for all wavelength regions, so that it is necessary to have a favorable optical performance across the entire visible region. Ordinarily, image-taking optical systems use the refraction of light with optical materials, such as optical glass or optical transparent resins, for the image-forming principle. Since the refractive index depends on the wavelength, an optical design method called color compensation (correction of achromatic aberration) is used to avoid a lowering of the imaging performance. As a result, it is difficult to configure a high-performance image-taking optical system with one lens, so that the miniaturization of the image-taking optical system becomes problematic.

Japanese Patent Application Laid-Open No. 2001-78212 achieves a compact and high-performance image-taking apparatus, but there are cases in which there are differences in the imaging performance of R, G and B light.

SUMMARY OF THE INVENTION

It is thus an object of the present invention to provide an image-taking apparatus with a small image-taking optical system, with which substantially the same optical performance can be easily achieved for light of various colors.

In order to attain this object, an image-taking apparatus according to one aspect of the present invention includes an image-pickup portion having a plurality of image-pickup regions, and a plurality of image-forming portions respectively corresponding to the plurality of image-pickup regions. The plurality of image-forming portions include a combination of image-forming portions that form object images on the corresponding image-pickup regions, by using light of mutually different wavelength regions. The image-forming portions constituting the combination have different F numbers or different aperture diameters of stops.

These and further objects and features of the image-taking apparatus of the present invention will become apparent from the following detailed description of preferred embodiments thereof taken in conjunction with the accompanying drawings.

DETAILED DESCRIPTION OF THE PREFERRED EMBODIMENTS

Referring to the accompanying drawings, the following is a detailed description of preferred embodiments of the present invention.

Figure 1:
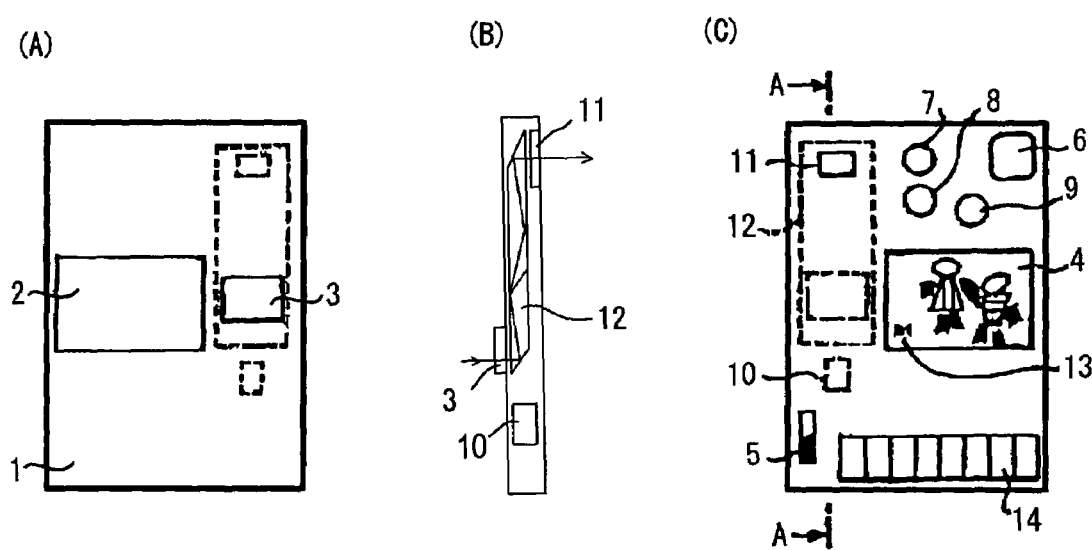
FIG. 1 shows diagrammatic views of essential portions of an image-taking apparatus.

FIGS. 1(A), (B) and (C) are diagrammatic views of the overall structure of a digital camera, which is an image-taking apparatus according to the present invention. FIG. 1(A) is a front view, FIG. 1(C) is a rear view, and FIG. 1(B) is a cross-sectional view along the position of the arrow A, shown in the rear view of FIG. 1(C).

In FIGS. 1(A), (B), and (C), Reference numeral 1 denotes a camera body, and Reference numeral 2 denotes a illumination light capturing window that is positioned on the rear side of a color liquid crystal monitor 4 and made of a white diffusion plate. Reference numeral 5 denotes a main switch, Reference numeral 6 denotes a release button, and Reference numerals 7, 8 and 9 denote switches with which the user sets the state of the camera. Of these, switch 9 is a reproduction button. Reference numeral 13 denotes a display of the remaining number of images that can be taken. Reference numeral 11 denotes a finder eyepiece window, from which object light is emitted that has entered a prism 12 from a finder front frame 3. Reference numeral 10 denotes an image-pickup system, and Reference numeral 14 denotes connection terminals that can be connected to an external computer or the like, and with which data can be sent and received.

Figure 2:
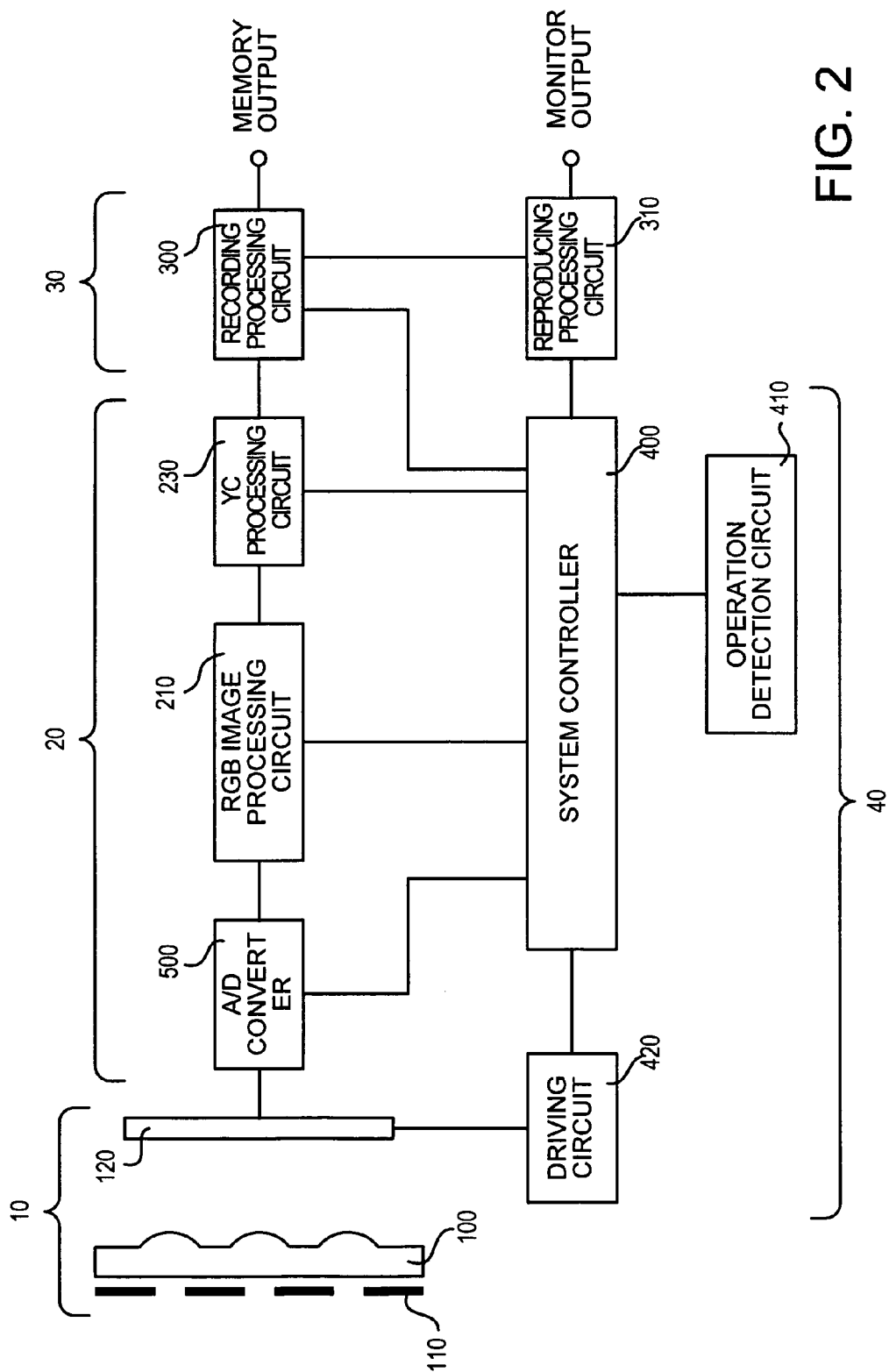
FIG. 2 is a block diagram of a signal processing system.

FIG. 2 is a block diagram of a signal processing system according to Embodiment 1 of the present invention. The image-taking apparatus (camera) according to Embodiment 1 is a single-plate digital color camera using a solid-state image-pickup element 120 such as a CCD sensor or a CMOS sensor, and this solid-state image-pickup element 120 is driven continuously or discontinuously to obtain image signals representing moving images or still images. Here, the solid-state image-pickup element 120 is an image-pickup device which converts the exposed light into an electric signal for each pixel, and accumulates an electric charge corresponding to the received light amount. The accumulated electric charge is read out.

It should be noted that FIG. 2 shows only the portions that are directly related to the image-taking apparatus of the present invention, and the representation and explanation of portions that are not directly related to the present invention have been omitted.

The image-taking apparatus shown in FIG. 2 includes an image-pickup system 10, an image processing system 20, a recording/reproducing system 30, and a control system 40. The image-pickup system 10 includes an image-taking lens (image-taking optical system) 100, an aperture stop 110 and a solid-state image-pickup element 120. The image processing system 20 includes an A/D converter 500, an RGB image processing circuit 210 and a YC processing circuit 230. The recording/reproducing system 30 includes a recording processing circuit 300 and a reproducing processing circuit 310. The control system 40 includes a system controller 400, an operation detection portion 410 and a driving circuit 420 for the solid-state image-pickup element 120. The image-pickup system 10 forms an image of an object on an image-pickup plane of the solid-state image-pickup element 120, with the light from the object via the aperture stop 110 and the image-taking lens 100. In this case, an object image of suitable light amount is exposed on the solid-state image-pickup element 120 by adjusting the optical transmittance of the image-taking lens 100. As mentioned above, for the solid-state image-pickup element 120, an image-pickup device such as a CCD sensor or CMOS sensor is used, and image signals representing continuous moving images can be obtained by controlling the exposure time and exposure interval of the solid-state image-pickup element 120, whereas image signals representing still images can be obtained with single exposures.

The image-pickup system 10 uses an image-pickup element 120 that is provided with a plurality of image-pickup regions, and an image-taking lens (image-taking optical system) 100 that is provided with a lens portion for each of the plurality of image-pickup regions. The image-pickup system 10 forms an object image by using light rays with mutually different wavelength regions for each of the plurality of image-pickup regions.

Figure 3:
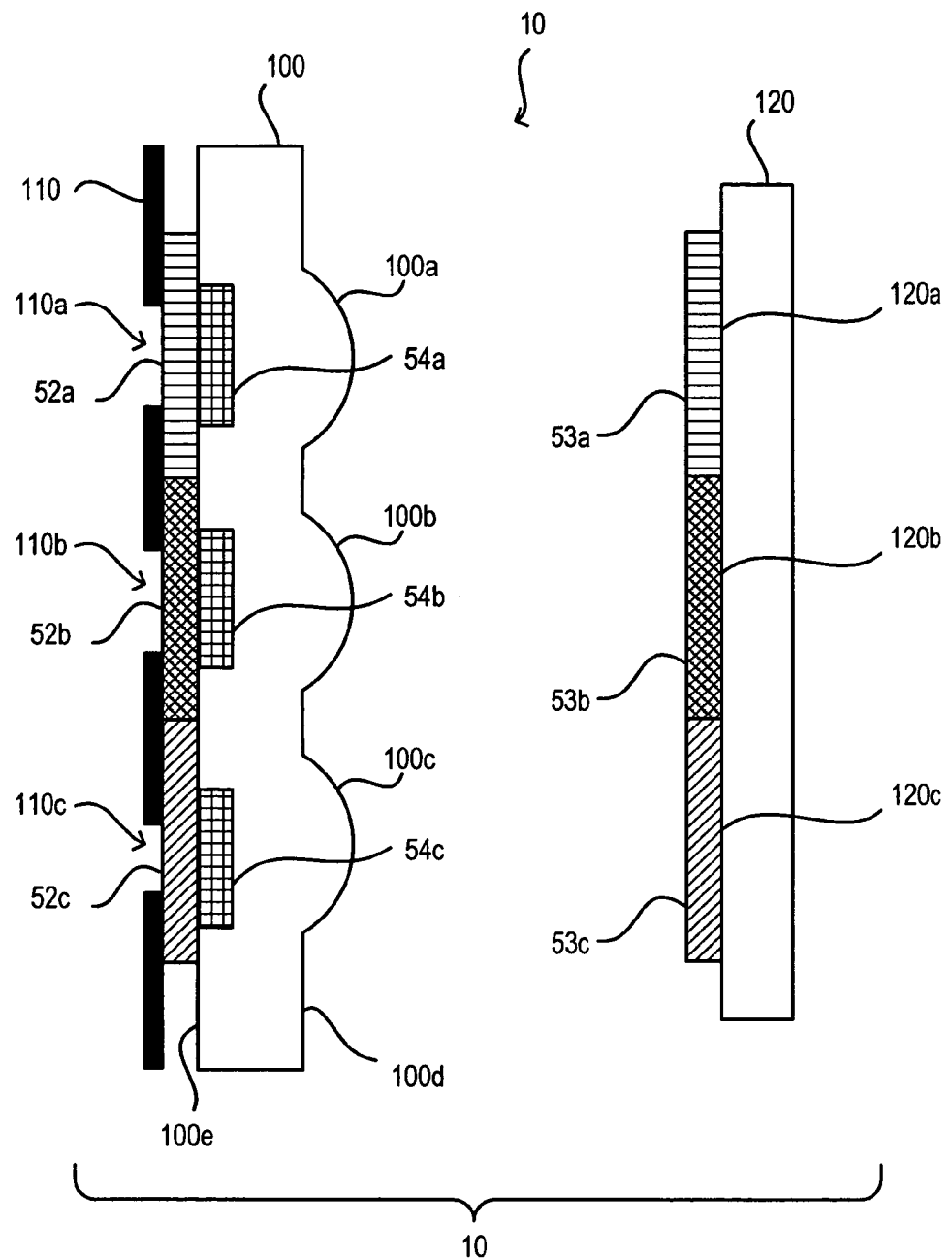
FIG. 3 is a cross-sectional view of an image-pickup system of an image-taking apparatus.
Figure 5:
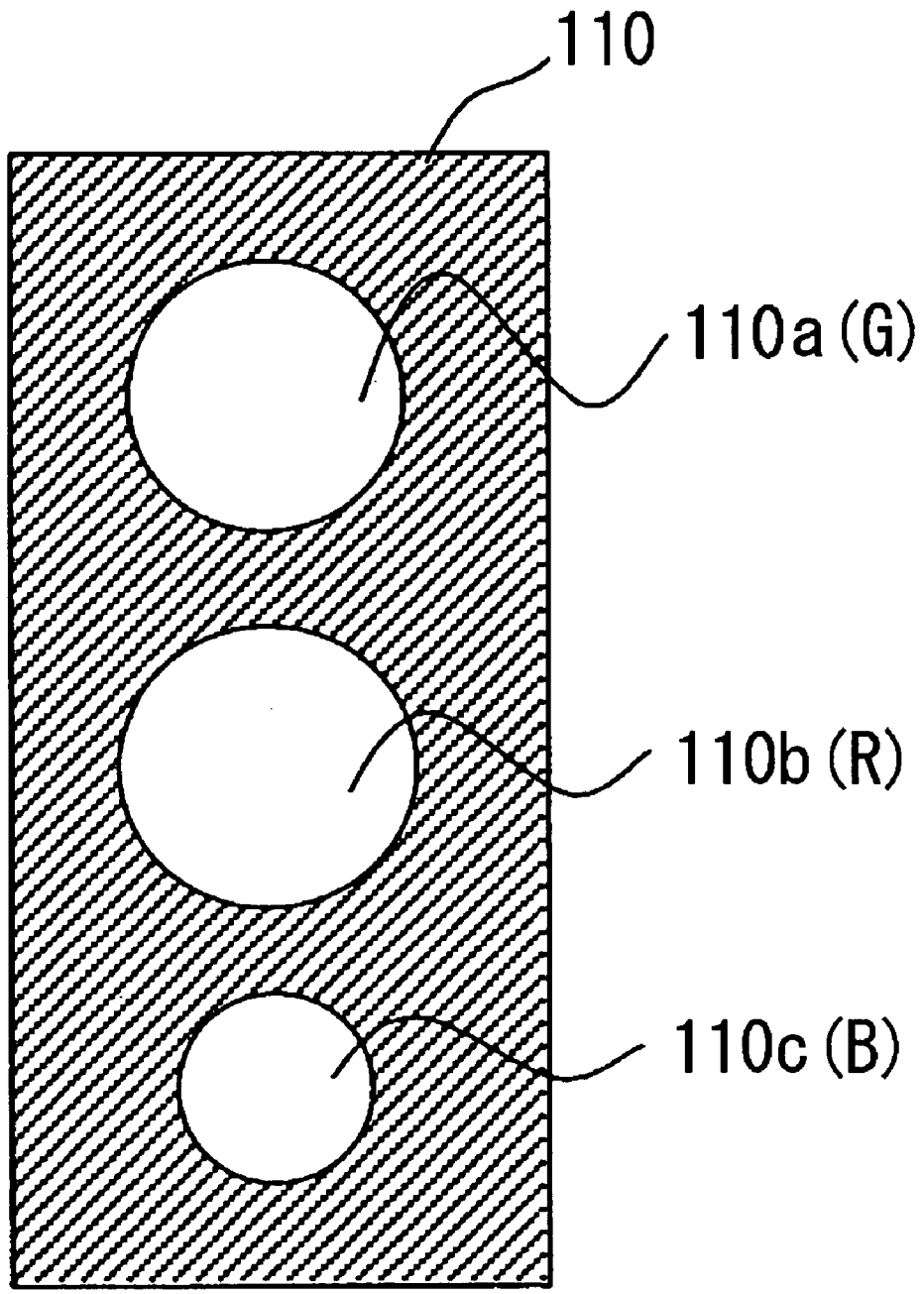
FIG. 5 is a top view of the aperture stop of the image-pickup system of FIG. 1.

FIG. 3 is a detailed diagram of the image-pickup system 10 of Embodiment 1. The aperture stop 110 has three circular apertures 110a, 110b and 110c of different sizes, as shown in FIG. 5. Light rays from the object, which are incident on an optical incident surface 100e with weak optical power of the image-taking lens 100 from the circular apertures 110a, 110b and 110c, are emergent from the three lens portions 100a, 100b and 100c with strong optical power on the emergent side of the image-taking lens 100, and form three object images on a plurality (three) regions on the image-pickup surface 120a of the solid-state image-pickup element 120.

A plurality of image-forming portions are constituted in correspondence with the plurality of image-pickup regions 120a to 120c by these three lens portions 100a to 100c and the circular apertures 110a to 110c provided in the aperture stop 110, as well as optical filters 52a to 52c and color purity correction filters 54a to 54c, which are explained below. The respective diameters of the apertures 110a, 110b and 110c of the aperture stop of this Embodiment 1 differ, and thus the resolution limit, which is determined in terms of wave optics for each image-forming portion is set such that it becomes the same (this includes ranges that can be regarded as the same in practice) for light of a predetermined wavelength in each image-forming system, as will be described below.

The aperture stop 110, the optical incident surface 100e and the image-pickup surface of the solid-state image-pickup element 120 are arranged to be parallel. By using the image-taking lens 100 with a surface of weak optical power on the incident side and a surface of strong optical power on the emergent side, and providing the aperture stop 110 on the incident side, the curvature of the image surface can be reduced. It should be noted that here, the optical incident surface 100e of the image-taking lens 100 is a flat surface or a surface with weak optical power, but it may also be configured as three spherical surfaces or three rotation-symmetric aspheric surfaces.

Figure 7:
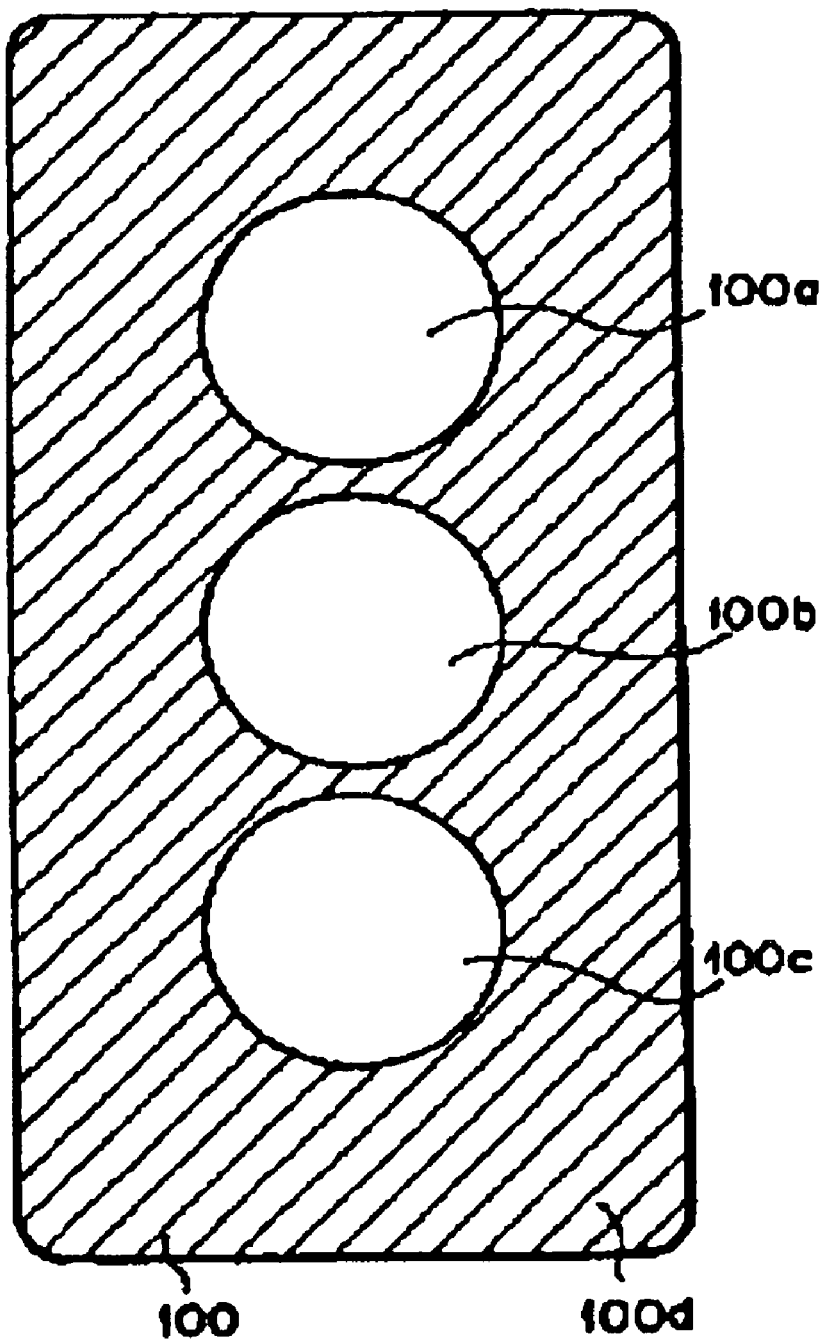
FIG. 7 is a diagram showing the imaging lens of the image-pickup system in FIG. 1, taken from the light emission side.

The three lens portions 100a, 100b and 100c have spherical portions with a circular shape as shown in FIG. 7 when viewing the image-taking lens 100 from the emerging side. The hatched portion in FIG. 7 is a flat portion 100d. That is to say, the image-pickup system 10 has the image-taking lens 100 and the aperture stop 110, and each of the three lens portions 100a, 100b and 100c constitutes the image-forming portion. Moreover, there are three image-pickup regions 120a to 120c on the image-pickup element 120 in correspondence to these lens portions. Of these, a first image-pickup region corresponds to the image-pickup region 120a and a second image-pickup region corresponds to the image-pickup region 120b or the image-pickup region 120c in FIGS. 3 and 4. Also the first image-forming portion corresponds to the lens portion 100a, and the second image-forming portion corresponds to the lens portion 100b or the lens portion 100c. Moreover, a first object image corresponds to the object image formed inside an image circle 51a, and a second object image corresponds to the object image formed inside an image circle 51b or an image circle 51c. Moreover, a first image signal corresponds to a G (green) image signal, and a second image signal corresponds to an R (red) image signal or a B (blue) image signal.

In the plurality of image-forming portions that are constituted by the lens portions 100a, 100b and 100c, etc., that are provided respectively for each of the three (plurality of) image-pickup regions 120a, 120b and 120c, the apertures 110a, 110b and 110c are provided with different diameters, thereby providing the image-forming portions with different F numbers.

If the image-taking lens 100 is made of glass, then it can be easily made by glass molding, and if it is made of plastic, then it can be easily made by injection molding.

Figure 4:
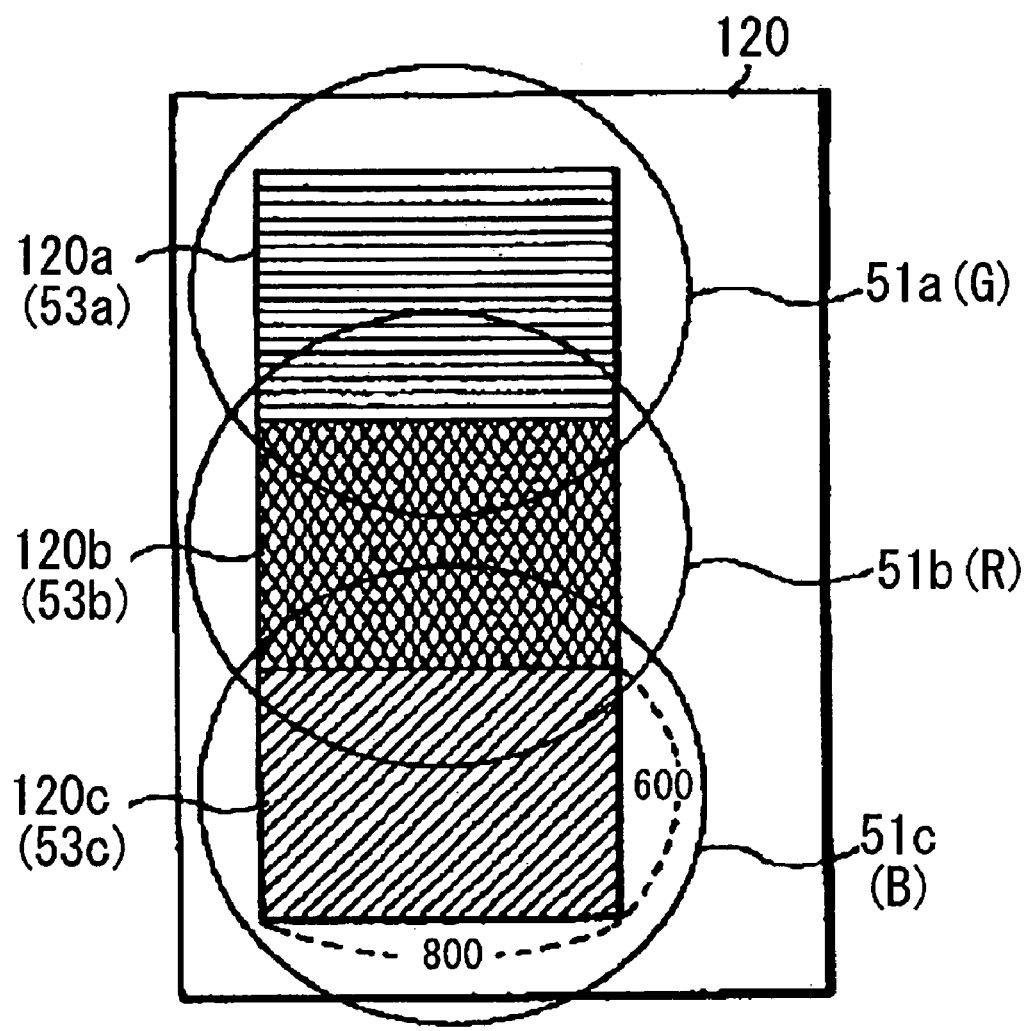
FIG. 4 is a front view of the solid-state image-pickup element of the image-pickup system in FIG. 1.

FIG. 4 is a front view of the solid-state image-pickup element 120, which includes three image-pickup regions 120a, 120b and 120c in correspondence with the three object images formed by the lens portions 100a, 100b and 100c. In FIG. 4, Reference numerals 51a, 51b and 51c denote image circles inside of which the object images are formed. The image circles 51a, 51b and 51c have a circular shape that is determined by the size of the apertures 110a, 110b and 110c of the aperture stop 110 and the size of the spherical portions on the emergent side of the image-taking lens 100. The image circle 51a overlaps with a part of the image circle 51b, and the image circle 51b in turn overlaps with a part of the image circle 51c.

Figure 6:
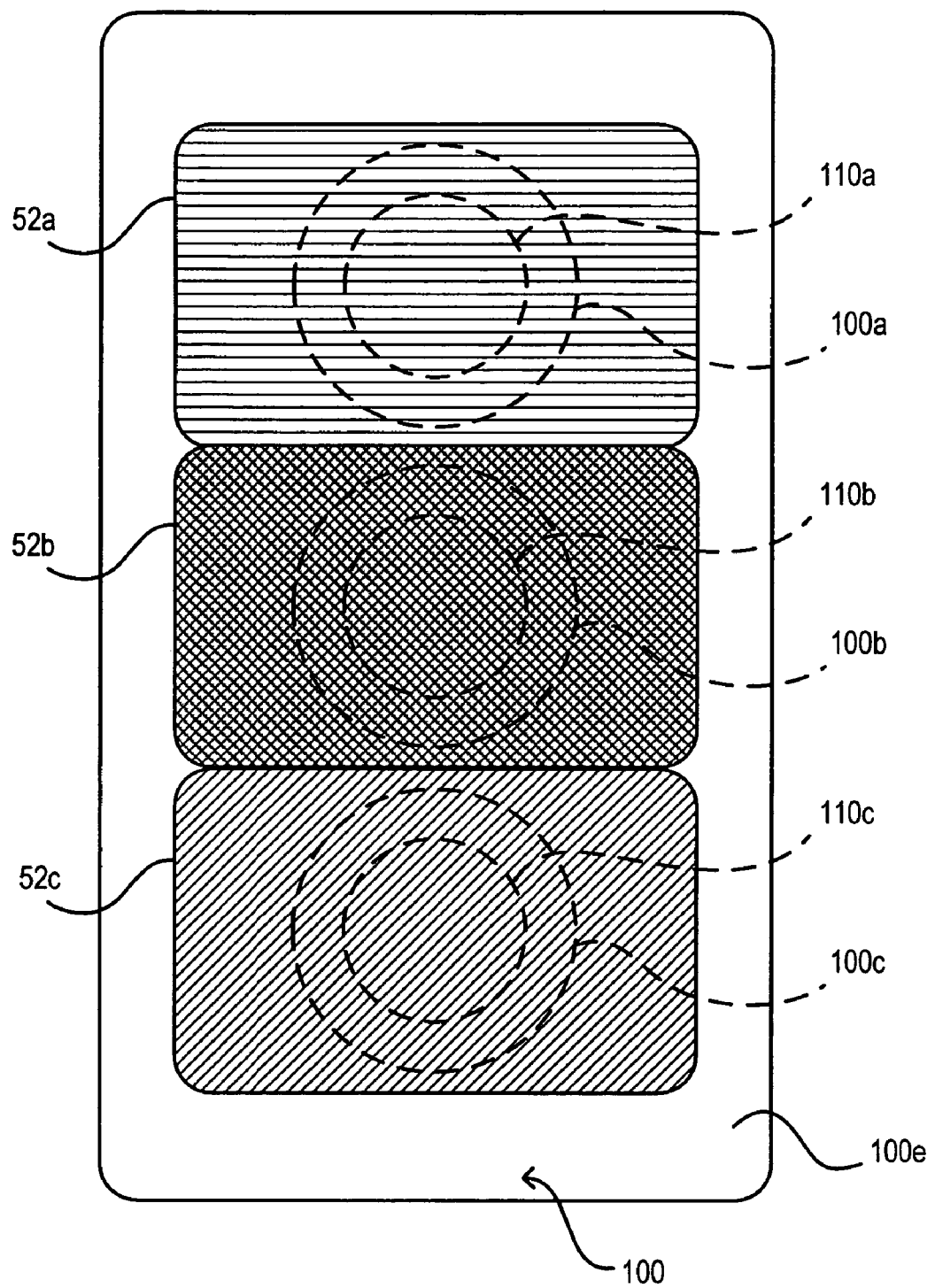
FIG. 6 is a diagram showing the range over which the optical filters of the image-pickup system in FIG. 1 are formed.

In FIG. 3, the hatched portions 52a, 52b and 52c of the region sandwiched by the aperture stop 110 and the image-taking lens 100 denote optical filters (color filters) that are formed on the optical incident surface 100e of the image-taking lens 100. The optical filters 52a, 52b and 52c are formed over regions that completely enclose the apertures 110a, 110b and 110c, as shown in FIG. 6, in which the image-taking lens 100 is viewed from the incident side.

Figure 8:
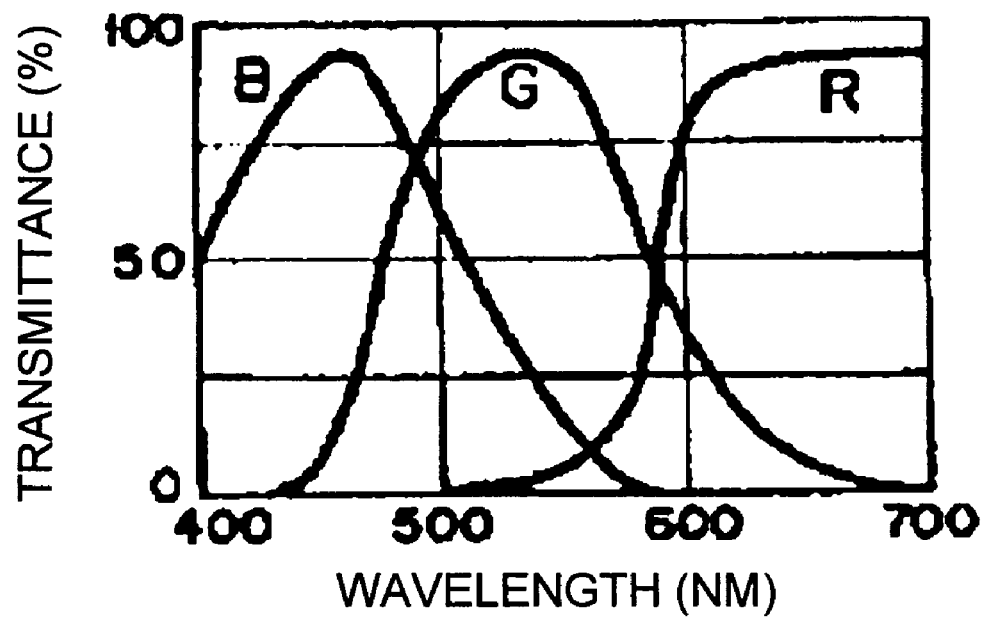
FIG. 8 is a graph illustrating the spectral transmittance characteristics of the optical filters of the image-pickup system in FIG. 1.

The optical filter 52a has spectral transmittance characteristics that transmit mainly green, as indicated by the curve G in FIG. 8, the optical filter 52b has spectral transmittance characteristics that transmit mainly red, as indicated by the curve R in FIG. 8, and the optical filter 52c has spectral transmittance characteristics that transmit mainly blue, as indicated by the curve B in FIG. 8. That is to say, they are primary color filters. The product of these characteristics and the characteristics of the infrared cut filter formed at the lens portions 100a, 100b and 100c, the object image formed in the image circle 51a is formed by a green component, the object image formed in the image circle 51b is formed by a red component, and the object image formed in the image circle 51c is formed by a blue component.

When $\lambda_L$ is a longer wavelength and $\lambda_S$ is a shorter wavelength among the center wavelengths of the wavelength regions of the light rays that are transmitted by the color filters 52a, 52b and 52c provided respectively at the image-pickup regions 120a, 120b and 120c (that is, the center wavelengths of the wavelength regions of light that is used by the combination of lens portions 100a, 100b and 100c), $F_L$ is the F number of the image-forming region onto which the light rays with the wavelength $\lambda_L$ are incident, and $F_S$ is the F number of the image-forming region onto which the light rays with the wavelength $\lambda_S$ are incident, then the following condition is satisfied:

$$F_L < F_S$$

Moreover, when $D_L$ is the aperture diameter of the aperture stop provided in the image-forming portion onto which the light rays with the wavelength $\lambda_L$ are incident, and $D_S$ is the aperture diameter of the aperture stop provided in the image-forming portion onto which the light rays with the wavelength $\lambda_S$ are incident, then the following condition is satisfied:

$$D_S < D_L$$

In Embodiment 1, the diameters of the apertures 110a, 110b and 110c of the aperture stop 110 are different for each of the image-pickup regions 120a, 120b and 120c, so that the transmittance of the optical filters 52a, 52b and 52c or the optical filters 53a, 53b and 53c can be set such that the signal level at each of the image-pickup regions, including the spectral sensitivity of the sensor, is appropriate for the same charge accumulation time.

It should be noted that the spectral transmittance characteristics of the optical filters 52a, 52b and 52c and the optical filters 53a, 53b and 53c are substantially separated for R and B, but overlap for R and G as well as for G and B, as shown in FIG. 8.

Consequently, even if the image circle 51b of red light cuts into the image-pickup region 120c where the blue light is photoelectrically converted, or conversely, if the image circle 51c of blue light cuts into the image-pickup region 120b where the red light is photoelectrically converted, then these images will not result in an output from the image-pickup region. However, at the portion where the image circle 51b of red light cuts into the image-pickup region 120a where the green light is photoelectrically converted, and at the portion where the image circle 51a of green light cuts into the image-pickup region 120b where the red light is photoelectrically converted, images of different wavelengths that should have been blocked overlap, if only slightly. That is to say, the selectivity of the object image is given by the product of the spectral transmittance characteristics of the optical filter 52a and the optical filter 53b and the product of the spectral transmittance characteristics of the optical filter 52b and the optical filter 53a, so that even though the crosstalk between the R image signal and the G image signal is small, it is not entirely zero.

In order to address this problem, in Embodiment 1, color purity correction filters 54a to 54c having characteristics that lower the transmittance in the wavelength regions of the overlapping portion of R and G are provided in the image-taking lens 100.

These color purity correction filters 54a to 54c are optical filters that contain a predetermined amount of rare earth metal ions within a base material made of transparent synthetic resin or glass.

Rare earth metal ions that can be suitably used are for example one or two or more of neodymium ions, praseodymium ions, erbium ions, holmium ions or the like, and it is preferable to use at least neodymium ions as required ions. It should be noted that ordinarily trivalent ions are used as the ions. Moreover, the content of the metal ions may be typically chosen from 0.01 to 40 weight portions, preferably 0.04 to 30 weight portions, for 100 weight portions of the base material of the image-taking lens 100. By using such filters, there will be substantially no crosstalk resulting from the image circle 51b of red light cutting into the image-pickup region 120a where the green light is photoelectrically converted or the image circle 51a of green light cutting into the image-pickup region 120b where the red light is photoelectrically converted.

The image processing system 20 forms a color image based on the selectively photoelectrically converted output that the image-pickup regions 120a, 120b and 120c of the solid-state image-pickup element 120 have respectively obtained from one of the above described plurality of images. While doing so, the peak wavelength of the relative luminosity is 555 nm, so that signal processing is carried out with the G image signal including this wavelength as the reference image signal.

The following is an explanation of the effect of providing the image-forming portions for obtaining the images of the various colors with different F numbers, or of providing the apertures 110a, 110b and 110c of the aperture stop 110 at the various image-forming portions with different aperture diameters.

Figure 9:
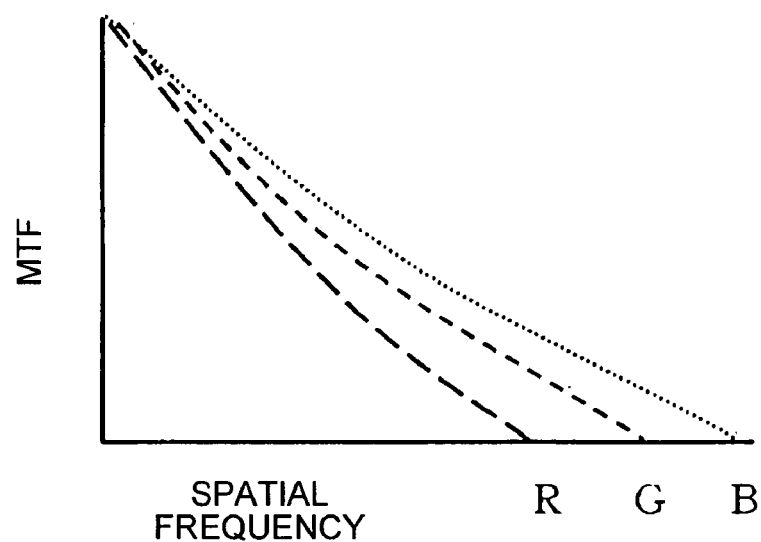
FIG. 9 is a graph illustrating the MTF for the image-pickup system of FIG. 1 when the aperture stop diameters are the same.

In recent years, due to the development of compact high-precision image-pickup elements, the manufacturing precision has become so high that the size of one pixel of the image-pickup element has been reduced to 2 to 4 μm. Accordingly, a high resolution is also demanded from the image-forming optical system (image-taking lens) that is provided. Typically, the response function of the spatial frequency, referred to as MTF, is given as an index for the power of the image-forming optical system. The horizontal axis marks the spatial frequency, that is, the number of lines (per mm) that exist per unit length, and the vertical axis marks the numerical value of the MTF at that spatial frequency, that is, the reproducibility of the image in numbers (see FIG. 9). A high numerical number of the MTF means a superior image-forming capability at that spatial frequency. FIG. 9 is a graph illustrating the MTF of an ordinary optical system having the same aperture diameters, or in other words the same F value.

In the graph of FIG. 9, the horizontal axis marks the spatial frequency, and the vertical axis marks the MTF. As shown in FIG. 9, as the spatial frequency becomes high, the numerical value of the MTF decreases, until it eventually becomes zero. For the different wavelengths (wavelength regions) indicated by the curves R, G and B in FIG. 9, the spatial frequency at which the MTF becomes zero differs, and in an optical system with small geometric aberrations, the magnitude relation of the MTF depending on the wavelength is the same across the entire spatial frequency region. The spatial frequency where the MTF becomes zero is referred to as the diffraction limit, and this diffraction limit is dependent on the wavelength. The spatial frequency f at the diffraction limit has been shown by Rayleigh to be:

$$f = 1/(1.22 \times \lambda \times Fno) \quad (1)$$

Beyond the diffraction limit, an MTF in principle cannot be obtained with ordinary aperture stops. With aperture stops of the same diameter, the resolution limit will differ for different wavelengths, as shown in FIG. 9. In Embodiment 1, by letting the size of the aperture diameters of the apertures $110a$, $110b$ and $110c$ differ depending on the wavelengths of light passing through them, as shown in FIG. 5, or by providing the lens portions with different F numbers, the MTFs for the various wavelengths can be adjusted to the same level, ensuring favorable resolution properties.

More specifically, when $\lambda_R$, $\lambda_G$ and $\lambda_B$ are, in order from the longest, the central wavelengths of the wavelength regions of the light rays passing through the color filters $52a$, $52b$ and $52c$ provided at the image-pickup regions $120a$, $120b$ and $120c$, and $F_R$, $F_G$ and $F_B$ are the F numbers of the image-forming portions on which the light rays of the wavelength $\lambda_R$, the wavelength $\lambda_G$ and the wavelength $\lambda_M$ are incident, then $F_R$, $F_G$ and $F_B$ are set such that:

$$F_R < F_G < F_B$$

Alternatively, when $D_R$, $D_G$ and $D_B$ are, in order, the aperture diameters of the aperture stops provided at the image-forming regions in which the light rays of the wavelength $\lambda_R$, the wavelength $\lambda_G$ and the wavelength $\lambda_M$ are incident, then $D_R$, $D_G$ and $D_B$ are set such that the following condition is satisfied:

$$D_B < D_G < D_R$$

Figure 10:
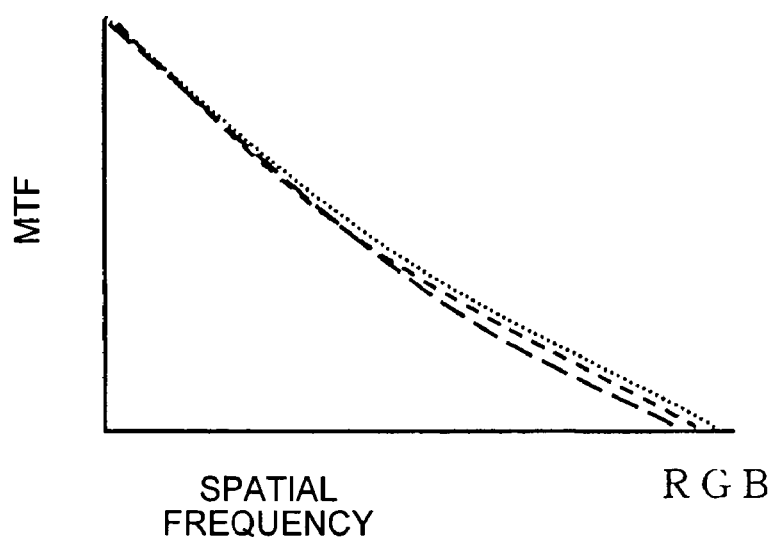
FIG. 10 is a graph illustrating the MTF for the image-pickup system of FIG. 1 when the aperture stop diameters are different.

With the above structure, the optical performance (MTF) of the optical systems corresponding to the three color filters for R, G and B can be made approximately identical, as shown in FIG. 10. Thus, achieving an improvement in the performance by letting the diameter of the aperture or the F number differ for each color of light is particularly useful in image-taking apparatuses employing simple optical systems, such as a single lens, as in Embodiment 1.

With optical systems in which a plurality of optical elements are used and the F number Fno can be made small, that is, the aperture diameter of the aperture stop can be made large while sufficiently correcting geometrical aberration, the diffraction limit of Equation (1) becomes sufficiently high and the influence of wavelength differences can be ignored. Embodiment 1 is thus an effective solution for achieving the desired high resolution with limited optical elements.

In order to improve the image-forming performance with limited optical elements, the influence of the geometrical aberration is ordinarily suppressed by narrowing down the light beams by geometrical optics and using a large F number Fno, thus improving the resolution of the image. However, when the spatial frequency becomes high, then the resolution is limited in practice, due to wave optics, by the diffraction limit given in Equation (1). If, conversely, a small F number Fno is used, then, even though the theoretical resolution limit is increased, optical aberrations put a limit on the improvement of the resolution. Consequently, the highest resolution performance is attained with the aperture diameter at the point of compromise where the MTFs of the two are substantially the same. This point depends on the wavelength, and it is difficult to realize the ideal form with an optical system with the same aperture diameter. By changing the aperture diameter for different wavelengths is advantageous in that the potential of image-forming optical systems with limited optical elements can be utilized in regions close to the diffraction limit.

It should be noted that when the apertures of the aperture stops are not circular (but for example polygonal), then the area of the polygons may be converted into the area of circles, and the diameters of those circles may be used.

While preferred embodiments have been described, it is to be understood that modification and variation of the present invention may be made without departing from the scope of the following claims.

What is claimed is:

1. An image-taking apparatus, comprising:
   an image-pickup portion comprising a plurality of image-pickup regions, and
   a plurality of image-forming portions respectively corresponding to the plurality of image-pickup regions, the plurality of image-forming portions comprising a combination of image-forming portions that form object images on the corresponding image-pickup regions, by using light of mutually different wavelength regions,
   wherein the image-forming portions constituting the combination have mutually different F numbers, by virtue of having mutually different aperture diameters of stops arranged in parallel, and
   wherein the following condition is satisfied:

$$F_L < F_S$$

where $\lambda_L$ is a longer wavelength and $\lambda_S$ is a shorter wavelength among the center wavelengths of the wavelength regions of the light used by the combination of image-forming portions, $F_L$ is the F number of the image-forming portion by using the light of the wavelength $\lambda_L$ and $F_S$ is the F number of the image-forming portion using the light of the wavelength $\lambda_S$.

2. The image-taking apparatus according to claim 1, wherein the image-forming portions constituting the combination comprise color filters of mutually different wavelength selectivity.

3. An image-taking apparatus, comprising:
   an image-pickup portion comprising a plurality of image-pickup regions, and
   a plurality of image-forming portions respectively corresponding to the plurality of image-pickup regions, the plurality of image-forming portions comprising a combination of image-forming portions that form object images on the corresponding image-pickup regions, by using light of mutually different wavelength regions,
   wherein the image-forming portions constituting the combination have mutually different F numbers, by virtue of having mutually different aperture diameters of stops arranged in parallel,
   wherein the following condition is satisfied:

$$F_R < F_G < F_B$$

where $\lambda_R$, $\lambda_G$ and $\lambda_B$ are the center wavelengths of the wavelengths regions of the light used by the combination of image-forming portions, in order from the longest wavelength, and $F_R$, $F_G$ and $F_B$ are the F numbers of the image-forming portions using light of the wavelength $\lambda_R$, the wavelength of $\lambda_G$ and the wavelength of $\lambda_B$, respectively.

4. An image-taking apparatus, comprising:

an image-pickup portion comprising a plurality of image-pickup regions, and a plurality of image-forming portions respectively corresponding to the plurality of image-pickup regions, the plurality of image-forming portions comprising a combination of image-forming portions that form object images on the corresponding image-pickup regions, by using light of mutually different wavelength regions, wherein the image-forming portions constituting the combination have mutually different aperture diameters of stops arranged in parallel, wherein the following condition is satisfied:

$$D_S < D_L$$

where $\lambda_L$ is a longer wavelength and $\lambda_S$ is a shorter wavelength among the center wavelengths of the wavelength regions of the light used by the combination of image-forming portions, $D_L$ is the aperture diameter of the stop in the image-forming portion using the light of the wavelength $\lambda_L$ and $D_S$ is the aperture diameter of the stop in the image-forming portion using the light of the wavelength $\lambda_S$.

5. The image-taking apparatus according to claim 4, wherein the image-forming portions constituting the combination comprise color filters of mutually different wavelength selectivity.

6. An image-taking apparatus, comprising:

an image-pickup portion comprising a plurality of image-pickup regions, and a plurality of image-forming portions respectively corresponding to the plurality of image-pickup regions, the plurality of image-forming portions comprising a combination of image-forming portions that form object images on the corresponding image-pickup regions, by using light of mutually different wavelength regions, wherein the image-forming portions constituting the combination have mutually different aperture diameters of stops arranged in parallel, wherein the following condition is satisfied:

$$D_B < D_G < D_R$$

where $\lambda_R, \lambda_G$ and $\lambda_B$ are the center wavelengths of the wavelengths regions of the light used by the combination of image-forming portions, in order from the longest wavelength, and $D_R$, $D_G$ and $D_B$ are the aperture diameters of the stops in the image-forming portions using light of the wavelength $\lambda_R$, the wavelengths $\lambda_G$ and the wavelengths $\lambda_B$, respectively.

7. The image-taking apparatus according to claim 3, wherein the image-forming portions constituting the combination comprise color filters of mutually different wavelengths selectivity.

8. The image-taking apparatus according to claim 6, wherein the image-forming portions constituting the combination comprise color filters of mutually different wavelengths selectivity.

* * * * *